US010690302B1

(12) United States Patent
Brooks et al.

(10) Patent No.: US 10,690,302 B1
(45) Date of Patent: Jun. 23, 2020

(54) FLEXIBLE AND CUTTABLE LED SHEET

(71) Applicant: BrooksCo, LLC, Wheat Ridge, CO (US)

(72) Inventors: David Brooks, Wheat Ridge, CO (US); Yulin Xu, Shiyan Town (CN)

(*) Notice: Subject to any disclaimer, the term of this patent is extended or adjusted under 35 U.S.C. 154(b) by 0 days.

(21) Appl. No.: 16/794,616

(22) Filed: Feb. 19, 2020

Related U.S. Application Data

(60) Provisional application No. 62/811,493, filed on Feb. 27, 2019.

(51) Int. Cl.
| | |
|---|---|
| F21S 4/22 | (2016.01) |
| H05B 45/20 | (2020.01) |
| F21Y 105/10 | (2016.01) |
| F21Y 115/10 | (2016.01) |

(52) U.S. Cl.
CPC .............. *F21S 4/22* (2016.01); *H05B 45/20* (2020.01); *F21Y 2105/10* (2016.08); *F21Y 2115/10* (2016.08)

(58) Field of Classification Search
CPC ........ F21S 4/22; H05B 45/20; F21Y 2105/10; F21Y 2115/10; F21Y 2101/00; F21Y 2107/00; F21Y 2107/70; F21V 5/00; F21V 5/007
USPC ....................................................... 362/555
See application file for complete search history.

(56) References Cited

U.S. PATENT DOCUMENTS

| | | | |
|---|---|---|---|
| 9,275,980 B2* | 3/2016 | Groenendaal | B32B 37/24 |
| 9,839,084 B2 | 12/2017 | Palfreyman | |
| 9,867,244 B2 | 1/2018 | Palfreyman | |
| 2015/0092413 A1* | 4/2015 | Li | F21S 4/22 |
| | | | 362/249.04 |
| 2016/0174321 A1* | 6/2016 | Mason | H05B 45/20 |
| | | | 315/153 |
| 2017/0254518 A1* | 9/2017 | Vasylyev | G02B 6/0073 |
| 2019/0032870 A1* | 1/2019 | Qiu | H05B 45/00 |
| 2019/0056078 A1* | 2/2019 | Bergman | F21V 23/001 |

* cited by examiner

*Primary Examiner* — Cara E Rakowski
*Assistant Examiner* — Jessica M Apenteng
(74) *Attorney, Agent, or Firm* — Patent Law Offices of Rick Martin, P.C.

(57) ABSTRACT

LED lighting sheets feature foldable light-sheets including multiple illumination modules electrically interconnected such that unremoved illumination units remain energized upon removal of one or more by horizontal, vertical and or diagonal cuts. A new and non-obvious conductor geometry forms a 3D mesh that is resistant to cutting from any direction in 45 degree increments. Relatively constant illumination levels are maintained in the remaining LEE's by using relatively high resistance series connected current limiting resistors for each LEE. Each current limiting resistor may be, for example, ten times the resistance of the entire lower ribbon conductive layer. Tunable color LEE's are included.

20 Claims, 13 Drawing Sheets

FLEXIBLE AND CUTTABLE LED SHEET

CROSS REFERENCED APPLICATIONS

This non-provisional application claims benefit of U.S. provisional application Ser. No. 62/811,493, filed on Feb. 27, 2019, which is incorporated herein by reference in its entirety.

FIELD OF INVENTION

The present invention relates to providing a thin foldable high density LED sheet that can be wrapped like gift wrap paper around an object such as a bar which is then covered by a translucent stone bar top.

BACKGROUND OF THE INVENTION

Uniform illumination across custom shapes and sizes is particularly difficult to achieve for a number of reasons. Incandescent and fluorescent light sources come in fixed sizes, limiting the granularity of the illumination sources— for example fluorescent tubes come in fixed lengths and cannot be cut to length. Lighting systems based on light emitting diodes (LEDs) typically are mounted on a circuit board having an electrical topology not amenable to being cut to length. For example, for large-area lighting applications, LEDs may be electrically laid out in groups of series-connected strings, e.g., on a square or rectangular tile, where each string contains multiple series-connected LEDs all operating at the same current. While in some topologies, one or more strings may be removed to permit dimensional customization, parts of a string typically cannot be removed without opening the circuit and causing de-energization of that string. The physical layout of the string therefore may limit the level of achievable granularity. Once installed in a lighting system, such fixed size illumination sources may visually result in regions having undesirably different light intensity levels or colors. A second issue with removing LED strings is that such systems are typically driven by a constant-current driver, so when one or more strings are removed, the current from the driver is divided among fewer strings, resulting in a local brightness increase. The lack of granularity in the sizing of the illumination sources and/or possible current variations between LEDs or groups of LEDs may result in visually distinguishable variations in light intensity level and/or color, for example correlated color temperature (CCT). From an application perspective, this is undesirable because the illumination level is desirably uniform over the entire illuminated area.

Another electrical topology that may be utilized for LED-based illumination sources is the connection of all of the LEDs in parallel. This topology may permit removal of individual LEDs and thus may achieve relatively finer granularity, in some cases on the order of the LED spacing. However, such systems are prone to "current hogging," in which the current preferentially flows through the LED(s) with the lowest forward voltage. This can result in increased heating of such LEDs, which further reduces the forward voltage, thus increasing the current-this process can continue until those LEDs fail. In some cases, this process may occur over and over, for example cascading from one LED to the LED having the next lowest forward voltage in the system. In some cases, this effect may be mitigated by carefully matching the forward voltage of all of the LEDs, but this typically adds significant expense.

Another approach is to incorporate a ballast resistor or other current-limiting device with each LED; however, this may increase cost and significantly reduce efficiency because of the power loss in the ballast resistor. A further efficiency disadvantage of this electrical topology is that it typically is driven at about the forward voltage of one LED. Low-voltage systems typically have increased power losses in the lines (wires) as well as lower driver efficiency.

A third electrical topology, using a constant-voltage supply in combination with an array, for example a parallel array, of small, low-cost LEDs configured in strings of series-connected LEDs, where each string also includes a current-regulating element, addresses a number of the deficiencies of the systems described above. Exemplary electrical and physical schematics of this approach are described in detail in U.S. patent application Ser. No. 13/799,807, filed on Mar. 13, 2013, (the '807 application) and U.S. patent application Ser. No. 13/970,027, filed on Aug. 19, 2013 (the '027 application).

SUMMARY

The main aspect of the present invention is to provide a 3D multi-layer flexible semiconductor sheet with a high density of light emitting elements (LEE).

Embodiments of the present invention relate to illumination systems based on areal light sheets that incorporate functionality that enables the arbitrary removal of one or more light-emitting elements, and/or one or more strings of light-emitting elements, while maintaining functionality of the unremoved light-emitting elements and light-emitting strings. In various embodiment, after removal of a light emitting element or string, the same operating voltage is maintained across the remaining, unremoved light-emitting elements or strings despite the removal of one or more light-emitting elements. Embodiments of the invention thus enable the shaping and/or size reduction of standard light sheets to meet a variety of different requirements.

As utilized herein, the term "light-emitting element" (LEE) refers to any device that emits electromagnetic radiation within a wavelength regime of interest, for example visible, infrared or ultraviolet regime, when activated, by applying a potential difference across the device or passing a current through the device. Examples of light-emitting elements include solid-state, organic, polymer, phosphor coated or high-flux LEDs, laser diodes or other similar devices as would be readily understood. The emitted radiation of a LEE may be visible, such as red, blue or green, or invisible, such as infrared or ultraviolet. A LEE may produce radiation of a continuous or discontinuous spread of wavelengths. A LEE may feature a phosphorescent or fluorescent material, also known as a light-conversion material, for converting a portion of its emissions from one set of wavelengths to another. In some embodiments, the light from a LEE includes or consists essentially of a combination of light directly emitted by the LEE and light emitted by an adjacent or surrounding light-conversion material. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein the term "reflective" is defined as having a reflectivity greater than 65% for a wavelength of light emitted by the LEE on which the contacts are disposed unless otherwise defined. In some embodiments, a LEE may include or consist essentially of an electronic device or circuit or a passive device or circuit. In some embodiments, a LEE includes or consists essentially of multiple devices, for example a LED and a Zener diode for static-electricity protection. In some embodiments, a LEE may include or consist essentially of a packaged i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essential of light emitted only by an LED.

The closest known prior art is U.S. Pat. No. 9,839,084. What is needed in the art is a very flexible LED sheet with the ability to cut and fold the sheet to wrap around custom shapes such as a table. The present invention allows horizontal, vertical and diagonal cuts to the sheet without losing power to the remaining interconnected LED's.

Other aspects of this invention will appear from the following description and appended claims, reference being made to the accompanying drawings forming a part of this specification wherein like reference characters designate corresponding parts in the several views.

| GLOSSARY | |
|---|---|
| AAA | Abbreviations |
| ABS | ABS Acrylonitrile Butadiene Styrene |
| ABS | ABS Acrylonitrile butadiene styrene |
| AC | AC Alternating Current |
| DC | DC Direct Current |
| HVAC | HVAC Heating ventilation air conditioning |
| LED | Light emitting diode |
| LED | LED Light emitting diode |
| LEE | Light emitting element |
| LEE | LEE Light emitting element |
| PTC | PTC Positive Temperature Coefficient |
| PWB | PWB printed wiring board |
| RGB | RGB Red green blue |
| RGBW | RGBW Red green blue white |
| SOC | SOC System on a Chip |
| UV | UV Ultra-violet |
| Zener | Zener Regulator diode |

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE DRAWINGS

Figure 1:
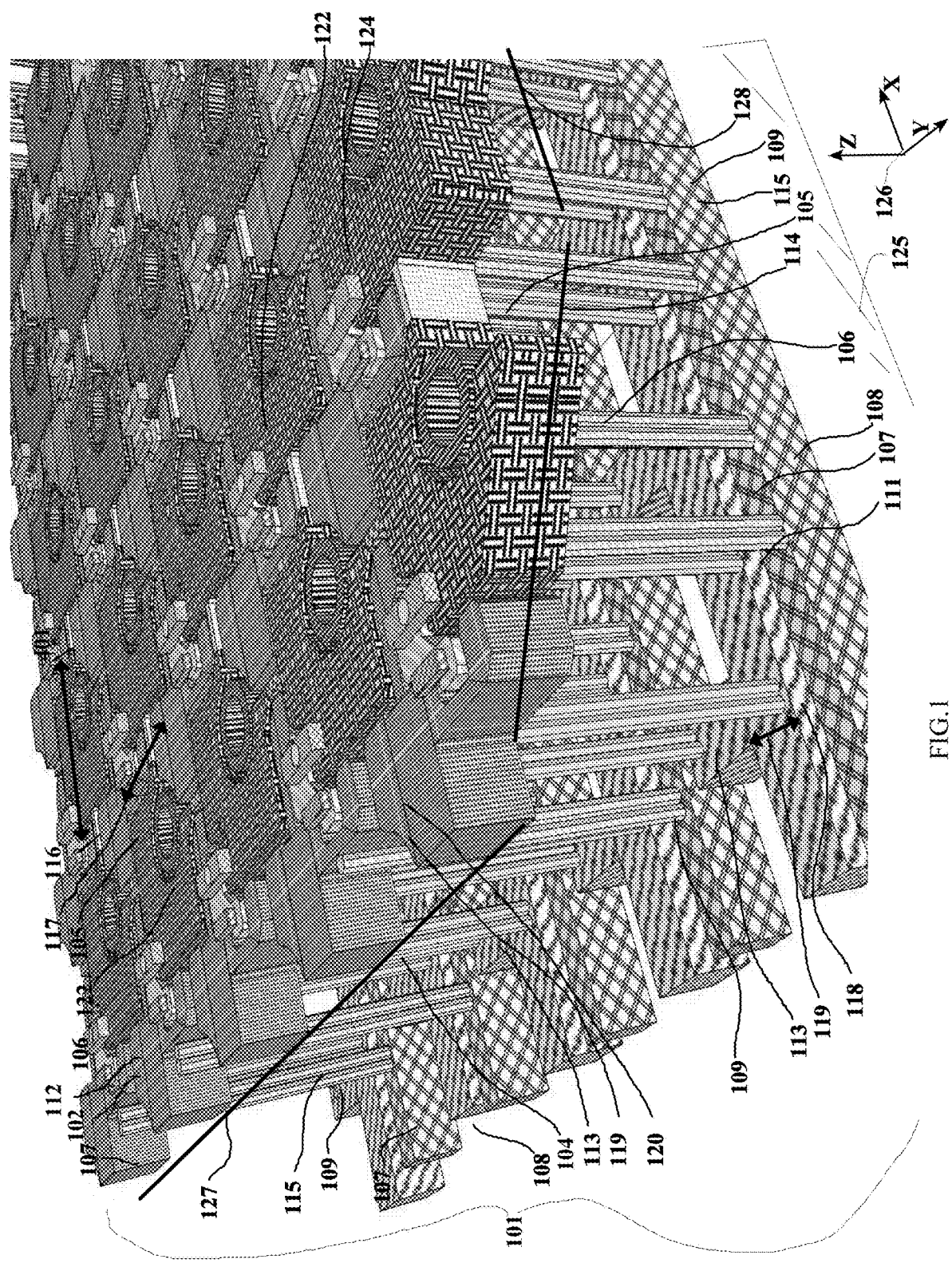
FIG. 1 is an enlarged top right perspective view of the flexible LEE sheet.
Figure 2:
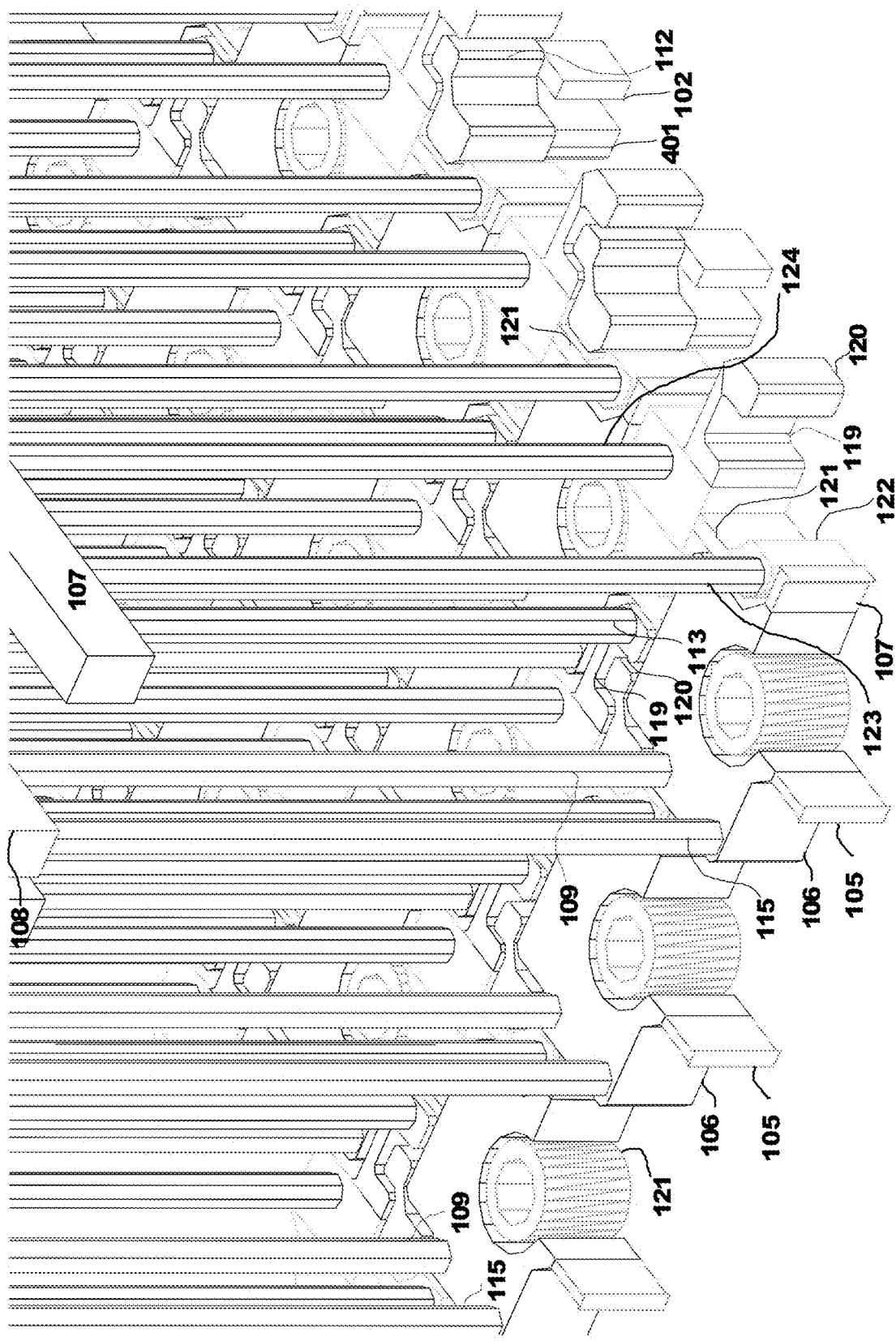
FIG. 2 is an enlarged side perspective view of the flexible LEE sheet.

FIG. 1 is a magnified isometric top view of the flexible light emitting sheet 101. An array of light emitting elements (LEE) 401 are by way of example and not limitation placed on an X-Y grid. For LEEs with a circular solid emission angle the LEE spacing 116-117 (X-Y) is equal. For elliptical solid radiation angles 501 (FIG. 5), 703 (FIG. 7) the LEE spacing 116-117 are adjusted to compensate for the non-circular radiation pattern for the particular LEE used as taught in FIGS. 5 and 7. Power is applied to first positive conductive element 106, from a connector pin 1220 (FIGS. 2,6). Conductive elements may be screen printed with conductive ink part number CL-1036 made by Engineered Material Systems, Inc 100 Innovation court, Delaware Ohio, USA by way of example and not limitation on a suitable flexible or rigid substrate 125. In the preferred embodiment Flexible Printed Circuit Board substrate, made by Huizhou Hongqi Electronic Technology Co., Ltd., No. 20, Dongjiang Industrial Park, Tongsheng East Road, Shuikou Town, Huicheng Dist., Huizhou, Guangdong, China. 516000 is used. In the preferred embodiment conventional photo etch two (2) ounce copper process is used. Not shown is a double sided adhesive 9474LE made by 3M, Electronics Markets Materials Division, 3M Center, Building 225-3S-06, St. Paul, Minn. USA, as applied to the back side of substrate 125. Copper (Cu) vias are fabricated by well-known in the art printed wiring board (PWB) methods and are offered by way of example and not limitation in the preferred embodiment. Note vias 109, 111, 113, 115, and 118 for clarity are drawn as oversized single conductors; in the preferred embodiment two or more closely spaced vias are employed for greater reliability and conductivity. Also, conductive vias heights are drawn oversize (not to scale) to help teach the three dimensional connection configuration. Conductive vias 109 and 115 provide independent and redundant current paths to conductive element(s) 106 and 108. Conductive member(s) 106 are connected to adjacent members with conductive links 105 and 124, thus forming a two dimensional X-Y 126 planar mesh network of positive conductors. Conductor(s) 108 extend the length of the array in the X direction, combined with Z-axis vias 109 and 115 form a second low impedance positive conductor paths. The addition of novel vias 109, 115 placement in Z-axis with second conductive layer members 108 now forms a three dimensional mesh.

Similarly return electrode is connected to conductive member(s) 104, connects via X direction bridge 121 (FIG. 2.) to conductor(s) 122 and also via Y-direction bridge 119 to conductor(s) 120. Then from conductor 122 via 111 to comb shaped conductor(s) 107, similarly conductor(s) 120 via 113 to conductor 107. Note due to current viewing angle via 118 is nearly hidden is perhaps better viewed in FIG. 2 or 3. Conductive member 104 is also connected to return conductor 107 via 113. Bridge segment 119 with vias 111, 113 and 118 provides alternate return current paths bridging around positive conductor(s) 108 not unlike a fish net.

Flexible array 101 may be attached to virtually any surface via, adhesive, or screw fasteners to mounting holes 129; or commonly mounted under a solid or flexible diffuser with silicone spacer(s) placed at location(s) 129. Due to the very robust design the LEE array with engineered spacers taught herein 101 is often installed under stone surfaces that easily support foot traffic. The unique design allows new to the art customization at time of install trim/cut to size with common tools such as routers and or scissors. While FIG. 1 is drawn not to scale, the flexible array 101 is less than three (3) mm thick easily applied around ninety (90) degree edges such as countertops. An optional conformal coating may be applied to array 101 for damp or even underwater application.

Current limiting resistor 102 first contact, connects to positive conductor(s) 106. Second contact of resistor 102 connects to conductor(s) 112. Anode/positive terminal of LEE 401 connects to 112, cathode/negative terminal of LEE 401 connects to return conductor(s) 104, thus completing and energizing the LEE array 101.

New to the art the LEE array 101 may be cut along the Y-plane 127, X-plane 128 and diagonal 114 while maintaining illumination. A plurality of individual elements may be removed along X, Y and diagonal planes while maintaining illumination to remaining LEEs 401. Exceptional flexibility and robust construction permits new to the art illumination applications.

FIG. 2 is a magnified isometric inside cutaway bottom view of flexible light emitting sheet 101. Power is applied to first positive conductive element 106, from a connector pin 1220 (FIG. 6). Like in FIG. 1 vias 109, 111, 113, 115, and 118 for clarity are drawn as oversized single conductors, in the preferred embodiment two or more closely spaced vias are employed for greater reliability and conductivity. Also, conductive vias heights are drawn oversize (not to scale) to help teach the novel three-dimensional connection configuration. Conductive vias 109 and 115 provide independent and redundant current paths to and from conductive element(s) 106 and 108. Conductive member(s) 106 are connected to adjacent members with conductive links 105 and 124, thus forming a two-dimensional X-Y planar mesh network of positive conductors. Conductor(s) 108 extend the length of the array in the X direction, combined with Z-axis vias 109 and 115 form a second low impedance positive conductor paths. The addition of novel vias 109, 115 placement in Z-axis with second conductive layer members 108 now forms a low impedance three dimensional mesh. In the preferred embodiment two (2) ounce copper is used for conductor elements shown as thick conductor 201.

Similarly return electrode 1206 is connected to conductive member(s) 122 and or 104 via component side solder pads. Conductor 104 (is more visible from FIG. 1 perspective), connects via X-direction bridge 121 (FIG. 2) to conductor(s) 122 and also via Y-direction bridge 119 to conductor(s) 120. Then from conductor 122 via 111 to comb shaped conductor(s) 107, similarly conductor(s) 120 via 113 to conductor 107. Conductive member 104 is also connected via conductor 123 to via 118. Bridge segment 119 with vias 111, 113 and 118 provides alternate return current paths bridging around positive conductor(s) 108 not unlike wire cloth or screen mesh. Flexible array 101 may be attached to virtually any surface via, preferred method is double sided adhesive, or alternatively screw fasteners to mounting holes 129. The light weight design allows installation on vertical surfaces, ceilings, even wrap around heating ventilation air conditioning (HVAC) ducting. The unique design allows new to the art customization at time of install trim/cut to size with common tools such as routers or scissors. Its light weight and ease of installation permits a single installer to quickly do large areas with minimal effort.

While FIG. 2 is not drawn to scale the, flexible array 101 is less than three (3) mm thick easily applied around ninety (90) degree edges such as counter tops. An optional water clear Silicone Conformal Coating 412 (FIG. 4), made by: Shenzhen Ju Keda Electronic material Co., Ltd., A area, First Floor, No. 67th Building, 2 Industrial Zone, Li Songlang Community, Gongming, Guangming Dist., Shenzhen, China. 518106 can be applied to the array and is used in an embodiment for damp or even underwater applications.

Current limiting resistor 102 is 1,500 Ohms in twelve (12) Volt version and 7,500 Ohms in the twenty four (24) Volt embodiment. Resistor first contact connects to positive conductor(s) 106 (not visible See FIG. 1). Second contact of resistor 102 connects to conductor(s)112. Anode/positive terminal of LEE 401 connects to 112, cathode/negative terminal of LEE 401 connects to return conductor(s) 104 (not visible See FIG. 1), thus completing and energizing the LEE array 101. Exceptional simplicity, flexibility and robust construction permits new to the art illumination applications.

Figure 3:
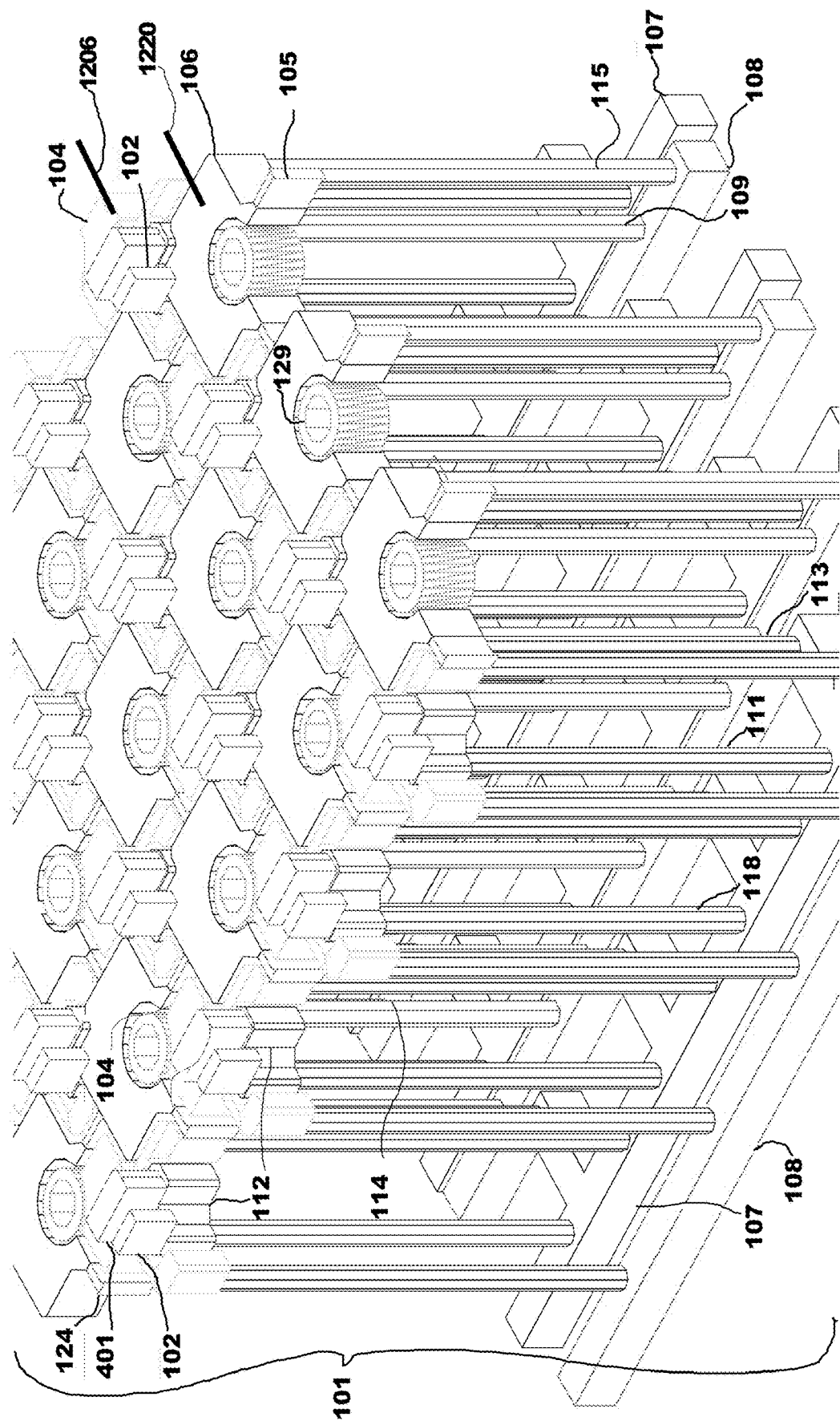
FIG. 3 is an enlarged top left perspective view of the flexible LEE sheet.
Figure 8:
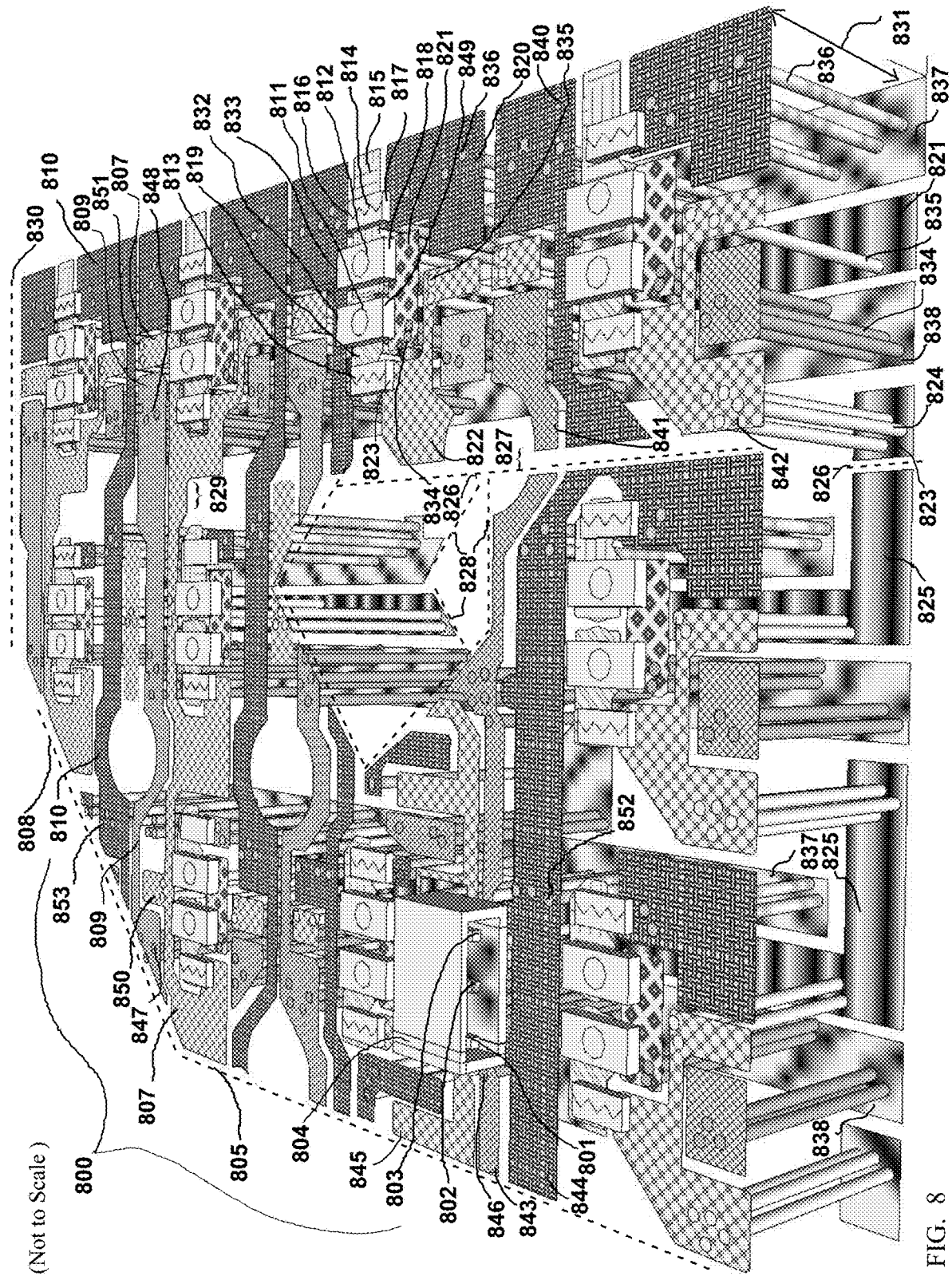
FIG. 8 is a top perspective view of a LEE sheet with two colors.

FIG. 3 is a magnified isometric left top view of flexible light emitting sheet 101. Power is applied to first positive conductive element 106, from a connector pin 1220 (FIG. 8). Like in FIGS. 1 and 2 vias 109, 111, 113, 115, and 118 for clarity are drawn as oversized single conductors, in the preferred embodiment two or more closely spaced vias are employed for greater reliability and conductivity. Also, conductive vias heights are drawn oversize (not to scale) to help teach the novel three-dimensional mesh connection configuration. Conductive vias 109 and 115 provide independent and redundant current paths to and from conductive element(s) 106 and 108. Conductive member(s) 106 are connected to adjacent members with conductive links 105 and 124, thus forming a two-dimensional X-Y planar mesh network of positive conductors. Conductor(s) 108 extend the length of the array in the X direction, combined with Z-axis vias 109 and 115 form a second low impedance positive conductor paths. The addition of novel vias 109, 115 placement in Z-axis with second conductive layer members 108 now forms a low impedance three dimensional mesh. In the preferred embodiment two (2) ounce copper is used for conductor elements shown as thick conductor 201. Similarly return electrode 1206 is connected to conductive member(s) 122 and or 104 via component side solder pads. Conductor 104 somewhat hidden in FIG. 2 view, connects via X-direction bridge 121 to conductor(s) 122 and also via Y-direction bridge 119 to conductor(s) 120. Then from conductor 122 via 111 to comb shaped conductor(s) 107, similarly conductor(s) 120 via 113 to conductor 107. Conductive member 104 is also connected via conductor 123 to via 118.

Bridge segment 119 with vias 111, 113 and 118 provides alternate return current paths bridging around positive conductor(s) 108 not unlike wire cloth or screen mesh.

Flexible array 101 may be attached to virtually any surface via, preferred method is doubles sided adhesive, or alternatively screw fasteners to mounting holes 129. The light weight design allows installation on vertical surfaces, ceilings, even wrap around Heating ventilation air conditioning (HVAC) ducting. The unique design allows new to the art customization at time of install trim/cut to size with common tools such as routers and or scissors. Its light weight and ease of installation permits a single installer to quickly do large areas with minimal effort. For placement under a diffuser special elastomer bumpers 515 (FIG. 5) are installed at location 129 to support the weight of the diffuser and additional application comprehensive loads. By way of example and not limitation ABS grade AF312C Thermoplastic bumpers made by LG Chem, 128, Yeoui-daero, Yeongdeungpo-gu, Seoul, Korea are used.

Figure 4:
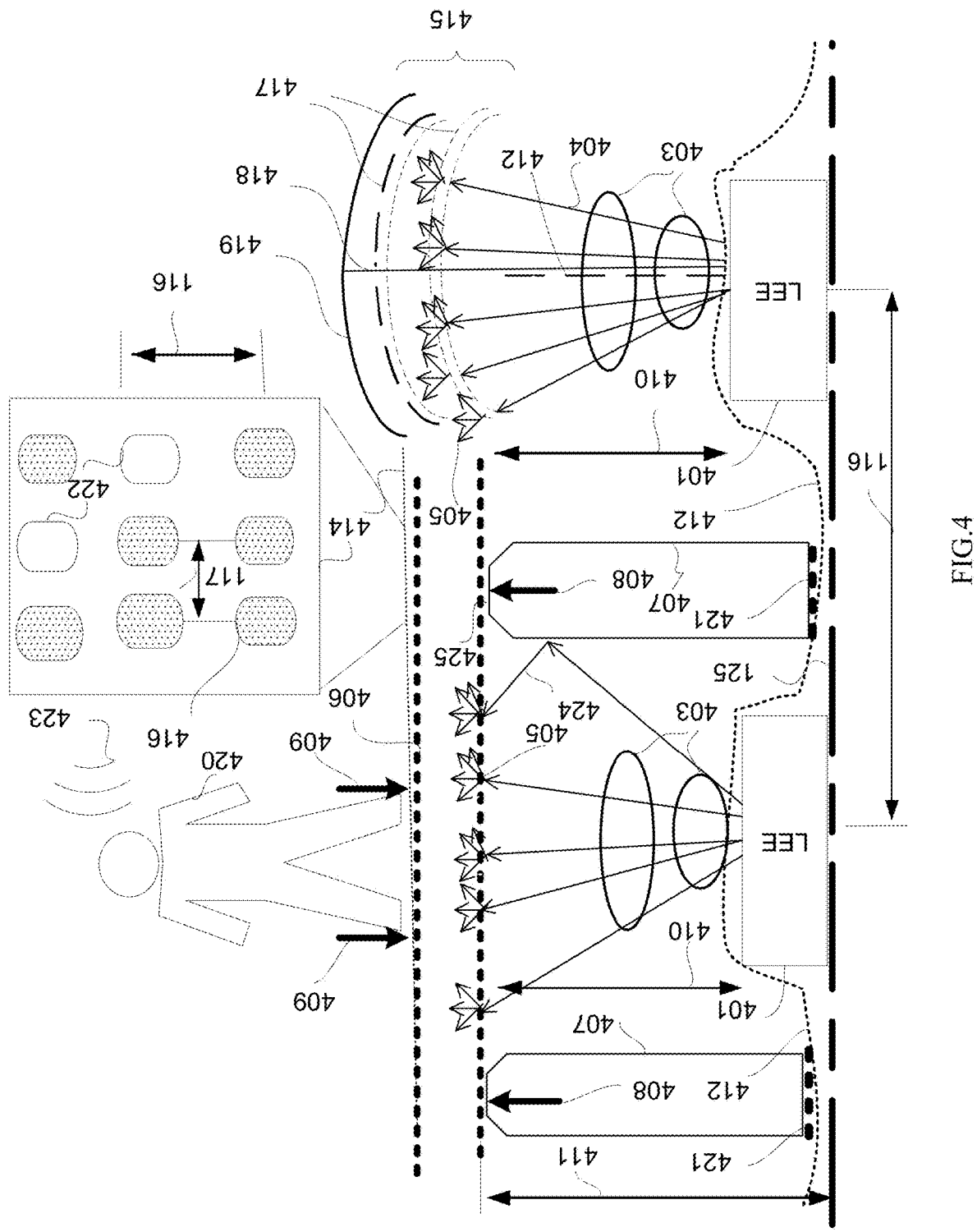
FIG. 4 is an edge perspective view of the LEE array with a solid diffuser.

The bumpers 407 (FIG. 4) not shown provide additional air space 410 (FIG. 4) between LEE 401 and diffuser 415 (FIG. 4) surface 414 and support substantial loads such as foot traffic 420 (FIG. 4).

While FIG. 3 is drawn not to scale, the flexible array 101 is less than three (3) mm thick easily applied folded around ninety (90) degree edges such as counter tops. An optional Silicone Conformal Coating 412 (FIG. 4), made by: Shenzhen Ju Keda Electronic material Co., Ltd., A area, First Floor, No. 67th Building, 2 Industrial Zone, Li Songlang Community, Gongming, Guangming Dist., Shenzhen, China. 518106, is used in the preferred embodiment may be applied to array 101 for damp or even underwater applications.

Current limiting resistor 102 is 1,500 Ohms in twelve (12) Volt version and 7,500 Ohms in the twenty-four (24) Volt embodiment, resistor first contact connects to positive conductor(s) 106. The resistance of the lower thick conductor 201 should be less than one tenth that of the current limiting resistor. Second contact of resistor 102 connects to conductor(s) 112. Anode/positive terminal of LEE 401 connects to conductor 112, cathode/negative terminal of LEE 401 connects to return conductor(s) 104 (not visible See FIG. 1), thus completing and energizing the LEE array 101. The low impedance design permits illuminating large areas without perceivable illumination differences at extremes from power entry point. Exceptional simplicity, flexibility and robust construction permits new to the art illumination applications.

FIG. 4 is an edge view perspective of the LEE array with a solid diffuser. Current art LEE designs commonly employ a lens to spread the light out for the object of uniform light intensity. Typically LEEs 401 are arranged in linear or two dimensional arrays used for area illumination. LEEs produce a semi-circular solid angle spherical illumination cone 403, often are rectangular revealing the rectangular emitter die geometry as rectangular 'hot spots' 416. Current art single emitter LEEs have a non-uniform semi-spherical narrow radiation angle intensity as shown in 701 (FIG. 7A). Subsequently, current art designs requires LEEs must be placed a large distance 411 from the surface 414 to be illuminated to minimize undesirable visible 'hot spots' 416. This larger diffusion distance results in greater volumes less compact designed and limits applications. The instant invention uses multiple emitter LEEs 401 in a single package as taught in FIG. 7B with large one hundred sixty (160) degree radiation angles. Thus greatly reducing the diffusion distance 410 and 'hot spot' visibility 416. The superior LEE used in this instant invention, also permit the use of thinner lower cost diffuser materials 415 thus reducing assembly volume and solving more illumination challenges. A specially formulated low creep Acrylonitrile butadiene styrene (ABS) bumper 407 as taught in FIG. 3 is placed as needed at mounting pad 129 (FIG. 1, 3).

Surface 414 to be illuminated by back lighting is placed at distance 411. Current art requires very large spacing 411 making the final assembly very thick. By way of example and not limitation sheet poly-carbonate and acrylic diffuser made by Curbell Plastics and others are used by way of example and not limitation in the preferred embodiment. In other applications diffuser 415 is natural stone forming a walking surface 406, or counter top. The ABS bumpers positioned at 129 (FIG. 1, 3) are designed to support 408 large compression loads 409 from for example foot traffic 420. Thus, new to the art a rugged, low profile LEE array as taught herein solves difficult lightning challenges even in damp conditions with large loads.

Multiple thin semi-ridged diffuser layers 417 may be inserted to enhance diffusion uniformity for historically difficult to illuminate curved surfaces 419. The flexible array 101 (FIG. 1) combined with the semi-ridged diffuser permits installations on difficult curved surfaces such as vertical support columns or overhead HVAC ducting with small bent radius 418. Diffuser material may also be selectively removed at time of install to make difficult areas such as corners and edges more uniformly illuminated with respect to the main surface.

The instant invention permits installers with simple tools trimming LEE array to fit at time of installation, light weight design with adhesive, providing uniform lighting (no hot spots) on surfaces as difficult and oddly shaped as HVAC ducting.

Figure 5:
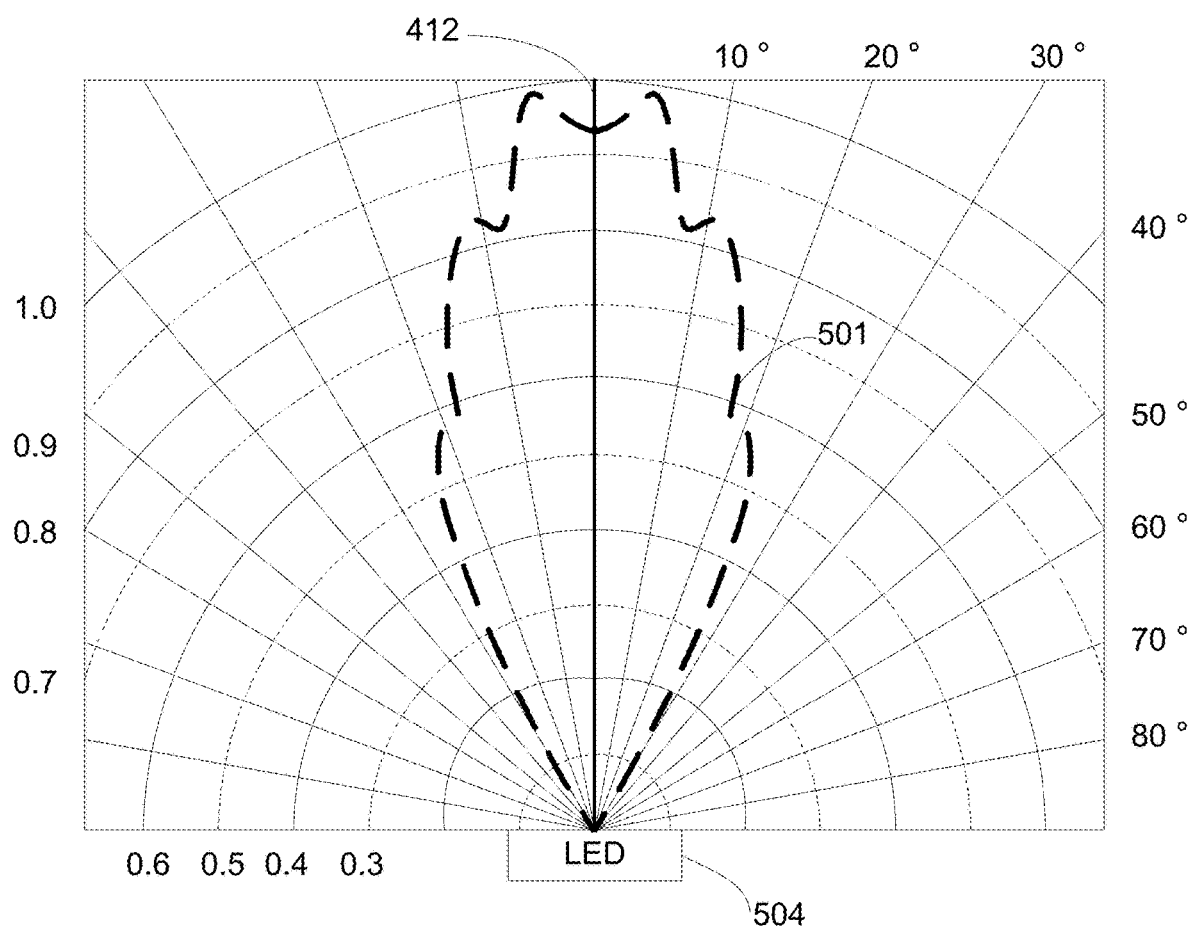
FIG. 5 is a graph depicting violet/blue LEE radiation distribution.
Figure 6:
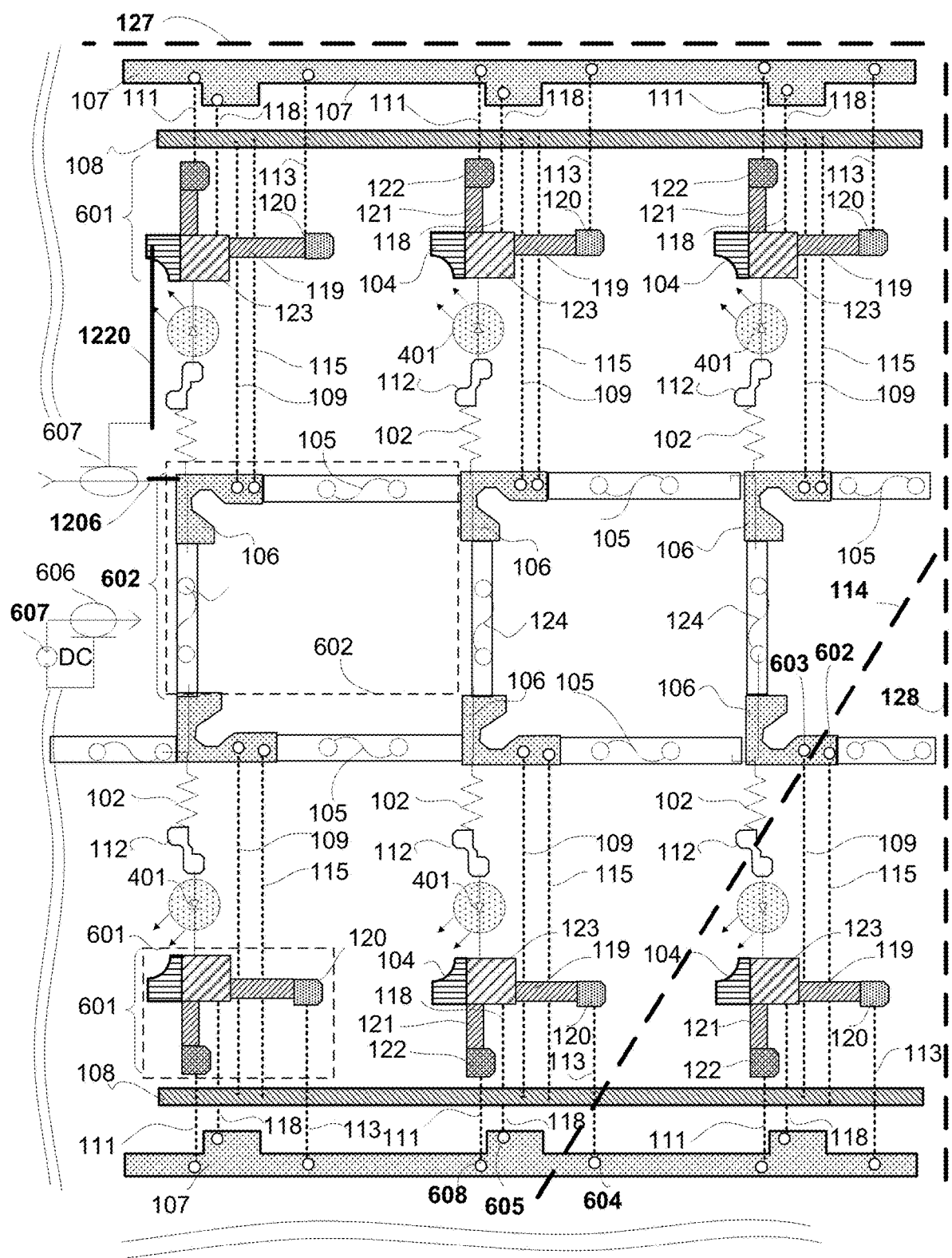
FIG. 6 is a mesh array schematic.

FIG. 5 is a single LED radiation graph. Individual LED's 504 have rectangular emitting areas, thus have very non-uniform radiation patterns 501. The rectangular emitting area often appear as 'hot spots' 416 as taught in FIG. 4 in some current art designs. Some current art LEE designs employ a lens to diffuse and focus the light to improve light intensity uniformity. To overcome uneven radiation patterns 501 a plurality of LEDs are arranged in two dimensional arrays to produce a more uniform illumination average 702 (FIG. 7) distribution. In the instant invention we have selected multiple small emitters in a common package such as the TZ2835-X518-CEJD-C0 used in preferred embodiment manufactured by Wincens Optoelectronics Co. Ltd., Wincens Industry Park, No. 268-3 Baoshi East Road, Shiyan Community, Bao an District, Shenzhen China is offered by way of example and not limitation. Multiple series LEDs has the advantage of operation at higher voltages with attending reduction in copper losses, and provides minimal voltage drop across LEE array thus uniform intensity. Also, normal variations in intensity and center wavelength of individual internal LEDs are averaged out, eliminating the need to sort or bin devices thus lowing costs. Lower operating currents maintains a relatively uniform voltage across the LEE array as taught in FIG. 4. The small voltage variations and LEE currents across the array from trimming and cutting are not perceivable to the eye. The wide uniform emission of multiple emitter LEE 402 (FIG. 7) angle 403 (FIG. 4) relative to center axis 412 simplifies diffuse design as taught in FIG. 4. Operation at lower currents also permits cutting, trimming or isolating LEE areas required for many challenging lighting applications that this apparatus addresses.

FIG. 6 is a schematic of the flexible LEE array mesh network. As taught in various isometric views FIGS. 1, 2, and 3 of the flexible light emitting sheet 101, FIG. 6 is a hybrid schematic of LEE 101. An array of light emitting elements (LEE) 401 are by way of example and not limitation placed on an X-Y grid. Power is applied to first positive conductive element 106, from a connector pin 1220. Note vias 109, 111, 113, 115, and 118 for clarity are drawn as single dashed lines, in the preferred embodiment two or more closely spaced vias are employed for greater reliability and conductivity. Also, conductive vias heights are drawn oversize (not to scale) to help teach the three dimensional connection configuration. Conductive vias 109 and 115 provide independent and redundant current paths to conductive element(s) 106 and 108. In the event of cutting array to size along for example line 114, cutting conductor 106 between via 109 termination 603, and via 115 termination 602 maintains two independent connections to node 108. Similarly cut 114 disconnects via 113 at 604 return path to LEE cathode, however the redundant geometry provide second path via 111 to 608 and third path via 118 to 605. The novel geometry allows the array 101 (FIG. 1) to be cut along vertical 128, horizontal 127 and diagonal 114 planes while maintaining power to remaining LEE(s) 401 with no perceivable change in brightness. As the 3D mesh forms two low impedance power planes. For example changes in mesh impedance from significant cutting are not visibly perceivable as the change may be as large as fifteen (15) ohms is less than one (1%) percent of the limiting resistor 102 that is in the range of 1,500-7,500 Ohms. The fractional change in LEE current/brightness is not perceivable by the human eye. To teach the geometry single contiguous conductor 602 in FIG. 6 is broken into segments 106, 105, and 124. Conductive member(s) 106 are connected to adjacent members with shown as conductive links 105 and 124, thus forming a two dimensional X-Y planar mesh network of positive conductors. Conductor(s) 108 extend the length of the array in the X direction, combined with Z-axis vias 109 and 115 form a second low impedance positive conductor paths. The addition of novel vias 109, 115 placement in Z-axis with second conductive layer members 108 now forms a three dimensional mesh. Note while drawn for simplicity as a single via, all are fabricated as two or more closely grouped together. Similarly return electrode 1206 is connected to conductive member(s) 104, connects via X-direction bridge 121 to conductor(s) 122 and also via Y-direction bridge 119 to conductor(s) 120. To teach the geometry single contiguous conductor 601 is broken into segments 104, 123, 119, 120, 121, and 122. Then connect to conductor via 111, 113, and 118 to comb shaped conductor (s) 107 that run length of array. Note due to limitations of rendering 3D objects on 2D paper FIG. 1-3 attempt to clarify vias is nearly hidden or difficult to determine origin and destination, this FIG attempts to further teach the geometry from a schematic perspective.

Conductive member 104 is also connected to return conductor 107 via 113. Bridge segment 119 with vias 111, 113 and 118 provides alternate return current paths bridging around positive conductor(s) 108 not unlike a woven cloth.

Flexible array 101 conductors are fabricated from two (2) ounce Cu using standard flex printed wiring board (PWB) methods. As such may be attached to virtually any surface with adhesive, screw fasteners as taught previously in FIG. 1. The copper foil design allows new to the art, customization at time of install trim/cut to any size or shape with common tools such as routers and or scissors. New to the art array 101 (FIG. 1) can be cut along horizontal 127, vertical 128, and diagonal 114 planes. An optional con-formal coating may be applied to array 101 for damp or even underwater application. Power is supplied externally from 607 to coaxial connector 606 that connects to mating connector 607. Current limiting resistor(s) 102 first contact connects to positive conductor(s) 106. Second contact of resistor 102 connects to conductor(s) 112. Anode/positive terminal of LEE 401 connects to 112, cathode/negative terminal of LEE 401 connects to return conductor(s) 104. Thus, completing and energizing the LEE array 101.

New to the art the LEE array 101 may be cut along the Y-plane 127, X-plane 128 and diagonal 114 while maintaining illumination. A plurality of individual elements may be removed along X, Y and diagonal planes while maintaining illumination to remaining LEEs 401. Exceptional flexibility, low impedance design, robust construction solves may current illumination challenges and creates new illumination applications.

Figure 7:
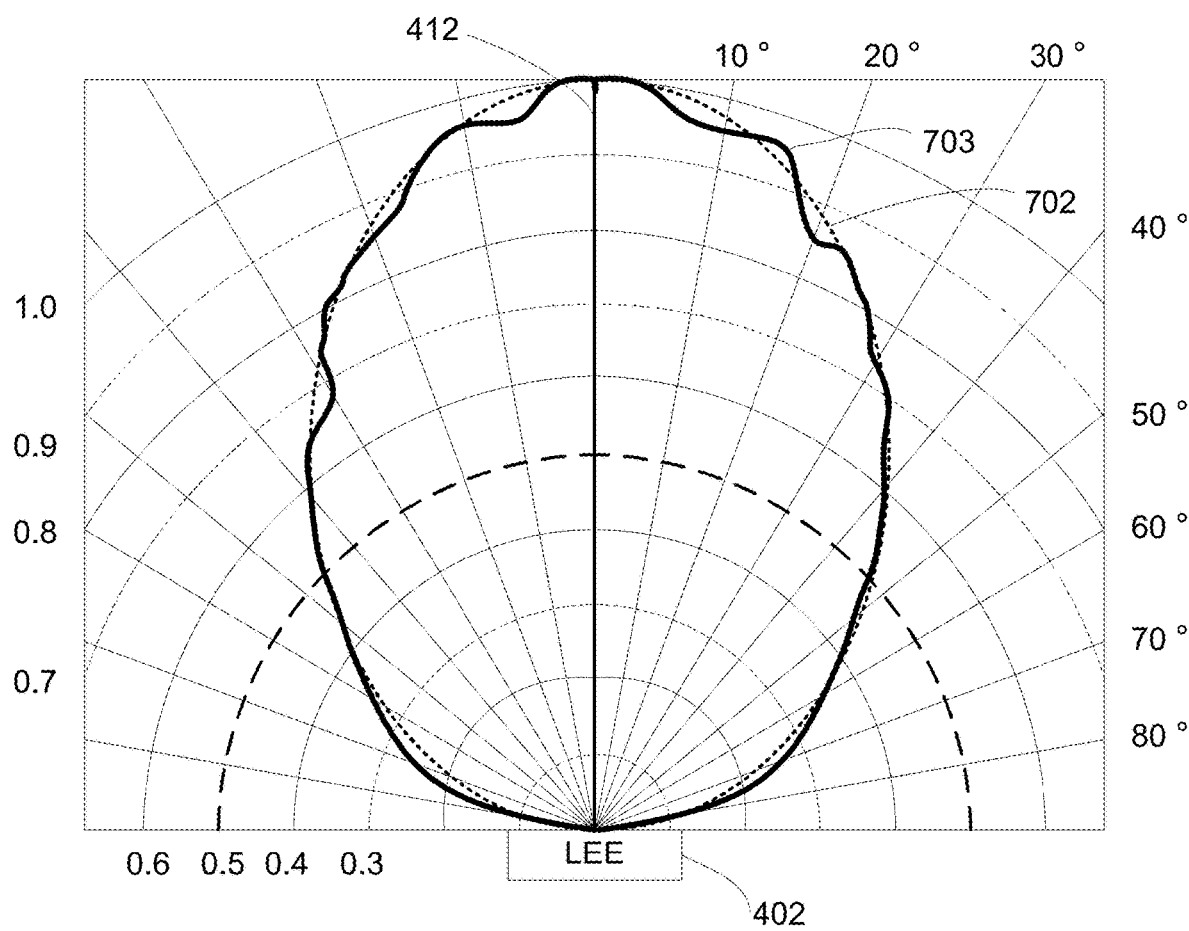
FIG. 7 is a graph depicting LEE white radiation distribution.

FIG. 7 shows multiple LEE in single package radiation graph. LEE manufacturers commonly mount arrays of single deep blue or ultra-violet LEDs in a single package filled with a phosphor blend to produce a range of "white" light. The specific phosphor blend determines conversion efficiency and color balance.

Individual LED's have rectangular emitting areas thus have very non-uniform radiation patterns 501 as shown in FIG. 5. Some current art LEE designs employ a lens to diffuse and focus the light to improve light intensity uniformity. To overcome uneven radiation patterns 501 (FIG. 5) LEEs are arranged in two dimensional arrays to produce a more uniform net illumination 703 distribution. In the instant invention we have selected multiple small emitters in a common package such as the TZ2835-X518-CEJD-C0 used in preferred embodiment manufactured by Wincens Optoelectronics Co. Ltd., Wincens Industry Park, No. 268-3 Baoshi East Road, Shiyan Community, Bao an District, Shenzhen China is offered by way of example and not limitation. Multiple series LEDs has the advantage of operation at higher voltages with attending reduction in copper losses, minimal voltage drop across LEE array thus uniform intensity. Also, normal variations in intensity and center wave length of individual internal LEDs are averaged out, eliminating the need to sort or bin devices thus lowing costs. Operation at lower currents also permits cutting, trimming or isolating LEE areas required for many challenging lighting applications that this apparatus addresses.

However, illumination color and intensity from current art LEE varies greatly with angle from center 501 axis 412 as taught in FIG. 5. Current art white multiple LEE have a non-uniform semi-spherical radiation average intensity as shown in 702. Even with optimal placement the resulting radiation patterns creates undesirable visibly bright "hot spots" 416 (FIG. 4). A need is met to provide uniform illumination at a low cost, cut to size at time of installation, conform to uneven surfaces, in more compact volume, and lighter weight. Not shown are micro +/−solder pads at each LEE terminal for use as power or sheet to adjacent sheet connectivity.

FIG. 8 Two Color Flexible LEE Sheet Top perspective. Flexible sheet 800 is drawn with enlarged longer interconnected vias 836 to help teach the novel three dimensional mesh, layer thickness 831 is in preferred embodiment 13 approximately 0.5 mm. Flexible LEE sheet 800 may be cut to size and shape with common scissors along diagonal(s) 808, vertical 805 or horizontal lines 830. LEE 811-812 with current limiting resistors 813 and 814 are uniformity distributed over LEE sheet 800. First terminal 818 of LEE 812 is in electrical communication to conductor 821. First terminal 849 of LEE 811 is also in electrical communication to conductor 821. Second terminal 832 of LEE 811 is in electrical communication to conductor 819, first terminal of resistor 813 is also in communication with 819. Second terminal 833 of LEE 812 is in electrical communication to conductor 815, first terminal 816 of resistor 814 is also in communication with 815. Second terminal 823 of resistor 813 is in electrical communication to conductor 822, conductive via 835 connects 822 to second level conductor 821. Second terminal 817 of resistor 814 is in communication with conductor 820, conductive via(s) 836 connects 820 to second level conductor(s) 837.

Figure 8A:
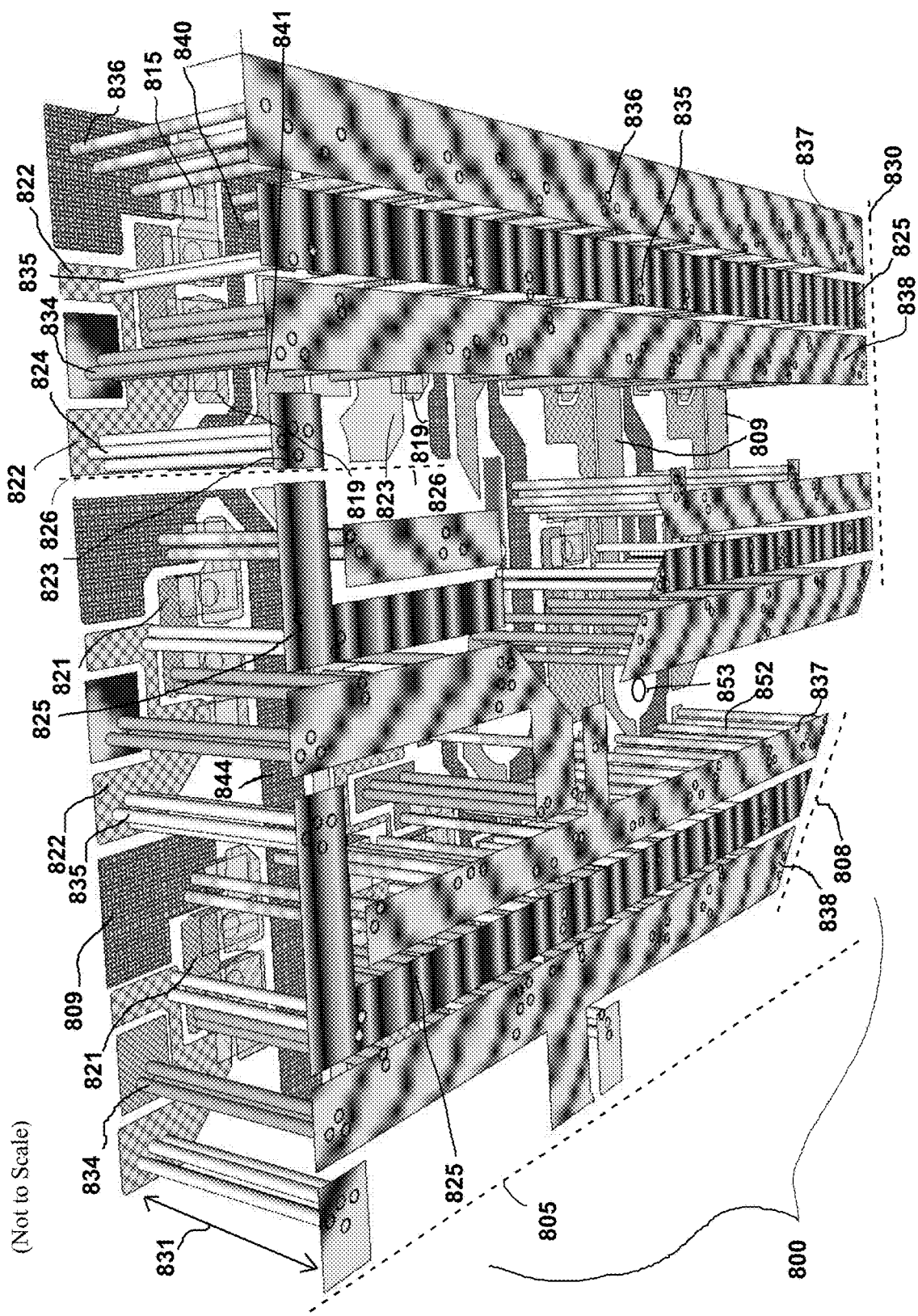
FIG. 8A is a bottom perspective view of the FIG. 8 LEE sheet.

Lower conductor 837 better shown in FIG. 8A traverses sheet 800 connects conductor 810 with via(s) 836. Note multiple vias are used to connect conductive pads for higher conductivity and greater reliability. In the preferred embodiment by way of example and not limitation two ounce copper foil is used to fabricate conductors. In alternate embodiment conductors may also be printed with conductive inks such as CI-1036 well known to the art made by Engineered materials 100 innovation ct, Delaware Ohio USA.

Figure 9:
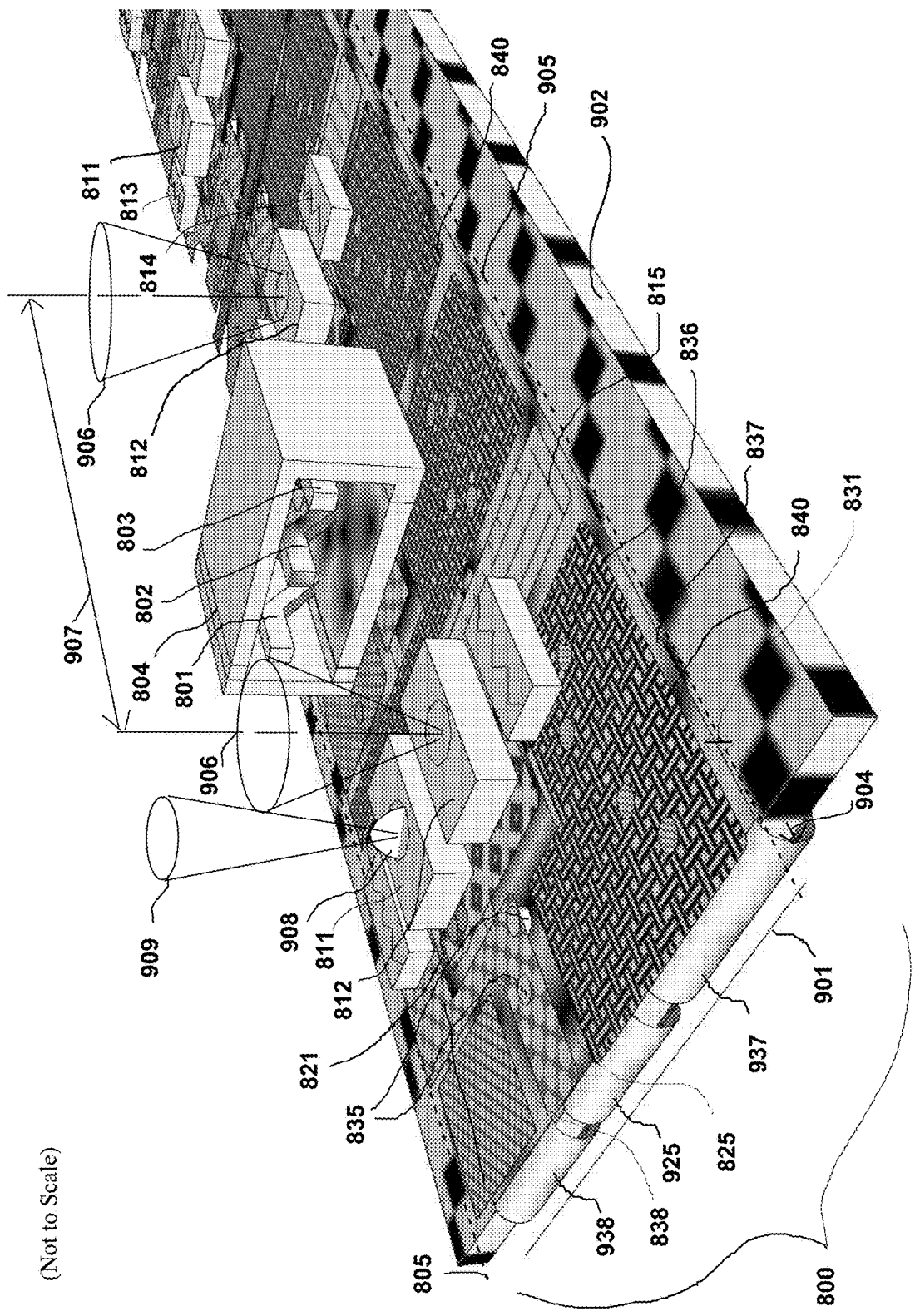
FIG. 9 is a top perspective close up view of the FIG. 8 LEE sheet.

A novel aspect of the invention is the ability to cut out one or more individual LEEs 811-12 to facilitate installation around pipes or fasteners. Also bending ground sharp corners or around thin sheets as taught in FIG. 9 is possible. During installation a common razor knife or scissor may be used to trim 800 to size and or make cuts along 826 to fabricate a void 828. Void path 827 severs multiple conductors 825 and 839, 840-41 potentially creating islands and disabling LEEs. However the novel design provides redundant current paths to providing power to LEEs. Power connector 804 pin 801 is in electrical communication with conductor 843 and formerly connected 841 before cut 826. Conductor 843 is connected to 838 via 846, via 847 connects 809 intern via 848 connects to lower conductor 838 via 834 provides alternate connection to 841. Multiple solder pads 861-863 are distributed across the array 800 allowing multiple power connectors 801 to chain multiple arrays together with jumper connectors. Connector 804 pin 802 is in electrical communication with conductor 845 and formerly connected 822 before cut 826. Conductor 845 is connected to 825 via 849 (FIG. 8A), via 850 connects 807 intern via 851 connects to lower conductor 821 via 835 provides alternate connection to 822.

Connector 804 pin 803 is in electrical communication with conductor 844 and formerly connected 840 before cut 826. Conductor 844 is connected to 837 via 852, via 853 connects 810 intern via 853 connects to lower conductor 837 via 836 provides alternate connection to 820.

The instant invention thin and supple LEE sheet may be wrapped around cylinders with a radius of 30 mm an improvement over ridged prior art. Application of conformal coat as taught in (FIG. 1) permits operation underwater or corrosive atmosphere. Time of install fabrication to fit complex surfaces and shapes with common scissors is a novel aspect of the instant invention. The unique ability of this invention to be bent, folded, cut to fit virtually any shape advances the art of lighting.

FIG. 8A Two color flexible LEE sheet bottom perspective. Flexible LEE sheet is drawn with enlarged interconnected vias 835, 836 and flexible substrate hidden to help teach the novel redundant three dimensional mesh. Layer thickness 831 in preferred embodiment is approximately 0.5 mm, conductors in preferred embodiment fabricated with two ounce per square inch copper. Total thickness with power and interconnect connector 804 (FIG. 8) is approximately 6.7 mm. Typically the LEE sheet 800 is affixed to a surface with adhesive or fasteners in round void area (s) 853. Flexible LEE sheet 800 may be cut to size and shape with common scissors along diagonal(s) 808, vertical 805 or horizontal lines 830. Volume fabrication of custom shapes with holes may be accomplished with common steel die cutting equipment. Novel to this invention is the ability to make cuts through actual resistor(s) and LEE(s) 811-81 4 while remaining LEEs remain illuminated. Creation of internal voids and removal of a plurality of LEEs is accomplished while maintaining power to LEEs via alternate current paths. A plurality of top surface LEE 811-81 2 (FIG. 8) with current limiting resistors 813-814 are uniformly distributed over LEE sheet 800. While more difficult to build an alternate embodiment LEE components may be placed on the second lower surface. A simpler solution to two sided illumination is to merely fold the sheet onto itself; or simply glue two sheets back to back. First terminal 801 of connector 804 is in electrical communication to conductor 843, vias 846 provide a conductive path to lower ribbon conductor (s) 838, vias 834 provide conductive paths to upper conductor(s) 821. Conductor 821 forms a return path for LEE 811-81 2.

First terminal 802 of connector 804 (FIG. 8) is in electrical communication to conductor 822, vias 835 provide conductive paths to lower ribbon conductor(s) 825, vias 825 provide conductive paths to U shaped upper conductor(s) 822. The novel U-shape conductor 822 with redundant vias forms a low impedance path bridging lower ribbon conductors 825. Conductor 822 is in communication with resistor 813, first terminal 823, second terminal communicates with conductor 819 and first terminal of LEE 811. First terminal 803 of connector 804 (FIG. 8) is in electrical communication to conductor 809, vias 836 provide conductive paths to lower ribbon conductor(s) 837, vias 836 provide conductive paths to U shaped upper conductor(s) 822. The novel serpentine shape conductor 810 with redundant vias forms a low impedance path bridging lower ribbon conductors 837. Conductor 820 is in communication with resistor 814 first terminal 817, second terminal communicates with conductor 815 and first terminal of LEE 812. Thus, formerly connected conductors 844 and 840 bisected by cut 826 remain in communication via alternate upper bridge paths 810 (FIG. 8) lower paths 837 with via 852.

Similarity by way of example isolated conductor 841 bisected by cut 826 remains in communication with power pin 801 via redundant vias 836, conductor(s) 837 and vias 852 to conductor 843.

Multiple solder pads 861-863 (FIG. 8) are distributed across the array 800 allowing multiple power connectors 801 to chain multiple arrays together with jumper connectors. Feed array from multiple diodes and power sources are not shown for increased reliability. Unlike prior art which uses low voltage LEE forming series strings, wherein a single element failure results in loss of illumination to many LEEs.

A single component failure losses only one LEE in the present invention. Well known to the art printed wiring board vias are unreliable, wherein most connections use three or more vias for additional reliability.

The novel conductor shapes with redundant vias forms a robust three dimensional flexible mesh supplying power to an array of LEEs. The geometry taught herein allows cutting to virtually any shape new which is new to the art. Incorporation of state of the art high voltage LEEs allows a relatively large limiting-resistor, thus small changes in mesh resistance occurs from trimming, and/or from cutting large arrays out without noticeable illumination changes visible to the human eye.

FIG. 9 Two color Flexible LEE sheet folded top isometric perspective. Flexible LEE sheet is drawn with interconnected vias 835, 836 drawn to scale with thin flexible substrate hidden to help teach the novel redundant three dimensional mesh. Layer thickness 831 in preferred embodiment is approximately 0.5 mm, conductors in preferred embodiment two ounce per square inch copper. Total thickness with power and interconnect connector 804 is approximately 6.7 mm. While shorter and smaller connectors are available ease of installation, more reliable and lower resistance terminations are desired. Typically LEE sheet 800 is affixed to a surface 902 with adhesive or fasteners. Emitters 812 are placed on a grid spaced 907 apart. LEE spacing 907 is based on particular LEE solid angle emission 906 and distance to surface of typically a diffuser to be illuminated. LEE 811-812 may be also fitted with over molded lens 908 to reduce solid angle 909 or diffuser to enlarge angle.

Flexible LEE sheet 800 as taught in FIGS. 8 and 8A may be cut to size and shape with common scissors along diagonal(s), vertical 805, 905 or horizontal lines. Additionally the sheet may be folded along diagonal(s), vertical 805, or horizontal lines 901. Fold angles of 0-180 degrees are easily achievable with very small bend radius 904 of only a few mm are possible. Lower ribbon conductors 837,838 and 825 are easily respectively folded 937, 938 and 925 around objects 902 and corners, earning the trade name Auragami (TM).

A plurality of top surface LEE 811-812 with current limiting resistors 813 and 814 are uniformity distributed over LEE sheet 800. While more difficult to fabricate an alternate embodiment LEE components may be placed on the second lower surface. However, a simpler solution to solve two sided illumination is to merely fold the sheet onto its self or around a thin support 902, or simply affix two sheets back to back. The apparatus taught herein greatly advances the art of lighting. With two color temperature LEEs powered by common art drivers permits a wide range intensity and colors.

Figure 10:
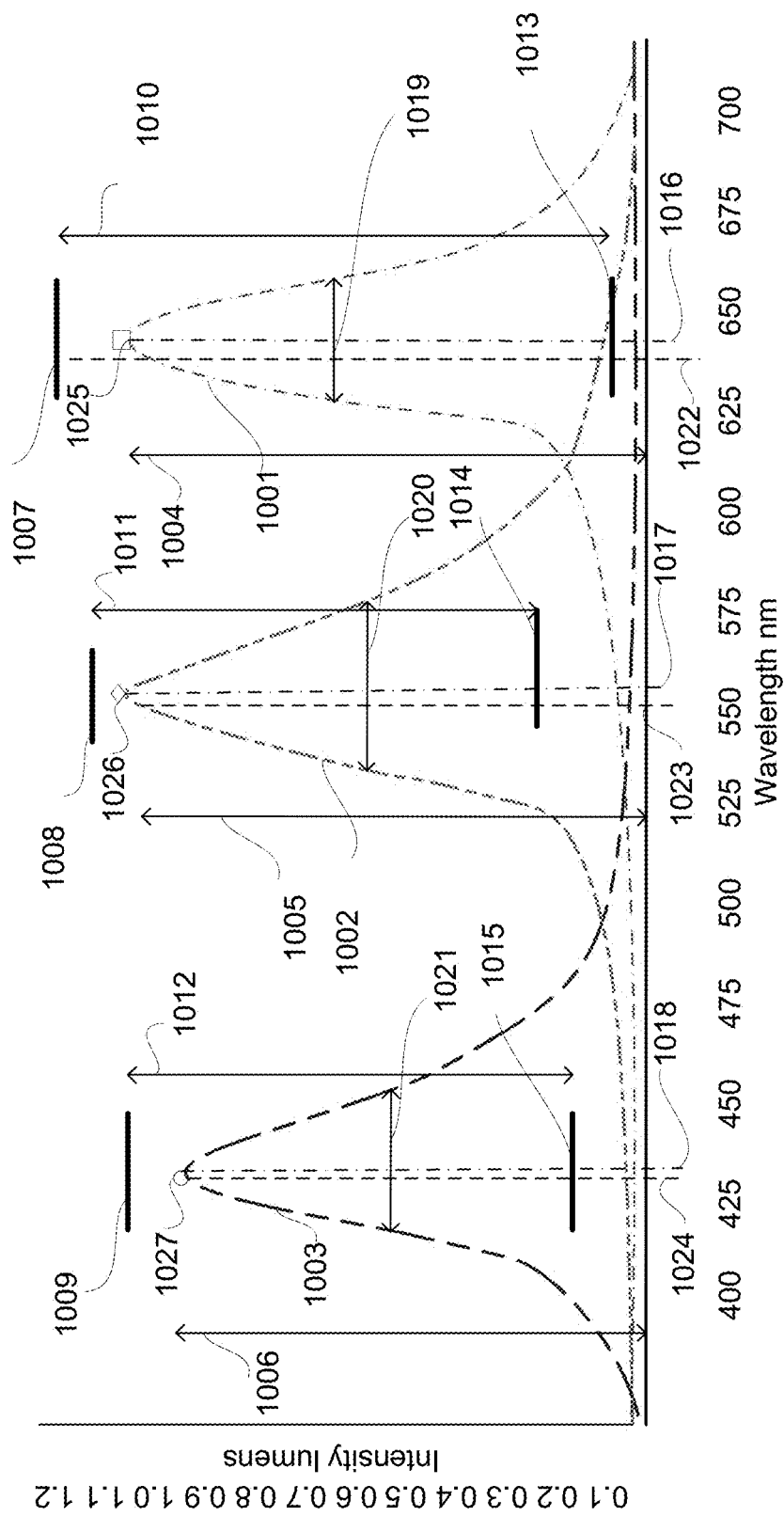
FIG. 10 is a chart of a RGB LEE Color Temperature Gamut.
Figure 11:
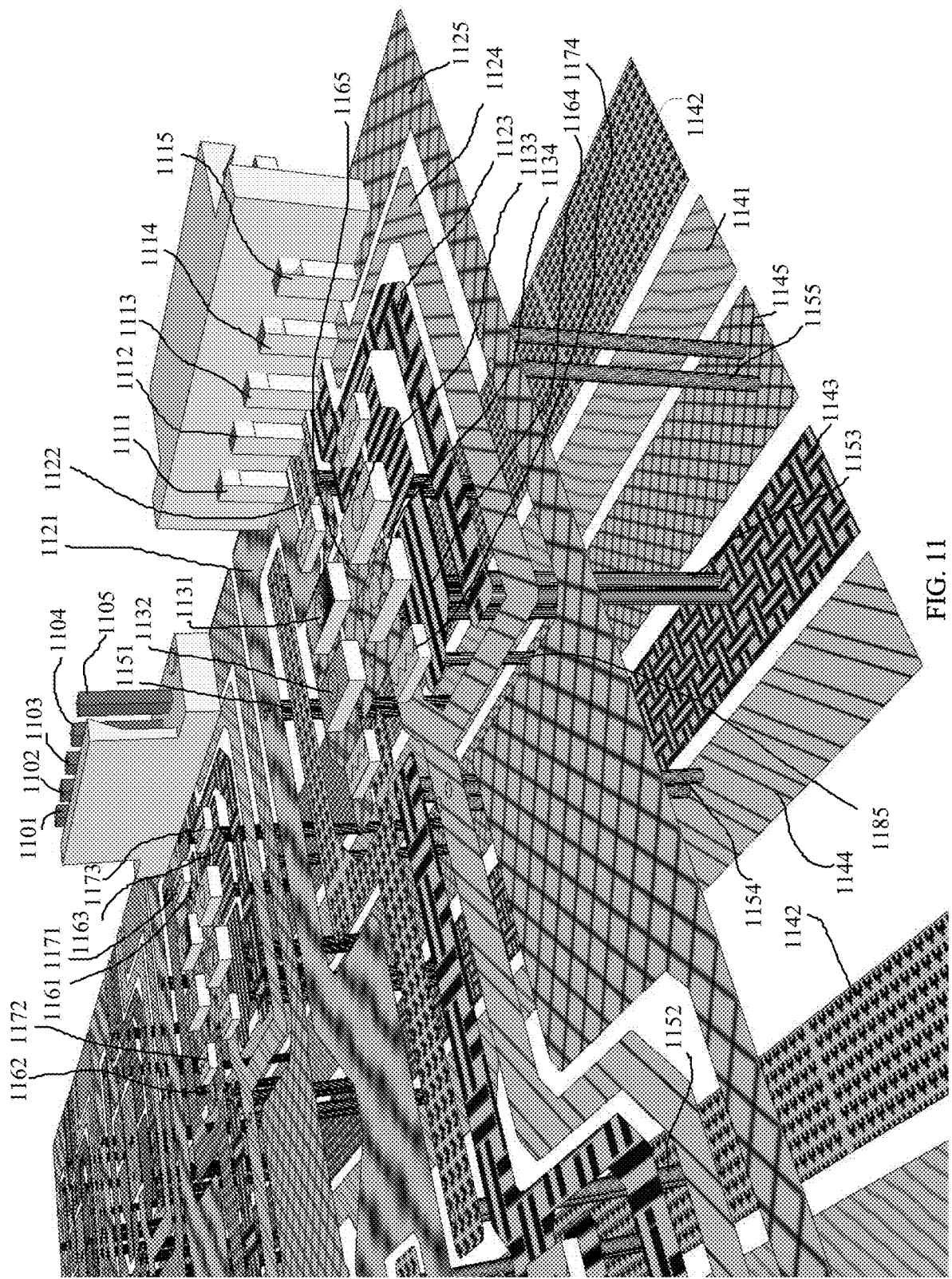
FIG. 11 is a top perspective view of a four color LEE sheet.

FIG. 10 Red Blue Green Gamut color mixing Well-known to the art arrays of RGBW emitters as taught in FIG. 11 may be modulated to cover a color or gamut area. Selection of LEEs power levels permit a wide range of illumination applications to be addressed with the novel flexible RGBW sheet. White papers such as Comparing Measures of Gamut Area by Michael P Royer of Pacific Northwest National Laboratory 620 SW 5th Avenue, Suite 810 Portland, Oreg. 97204 michael.royer@pnnl.gov teach this.

Red LEE has a typical power vs wavelength distribution, with mean center wavelength 1016. Current range controls maximum brightness 1007. Minimum brightness is set by the current that just turns on all LEES. Green LEE has a typical power vs wavelength distribution with mean center wavelength 1017. Current range controls maximum brightness 1007. Minimum brightness 1014 is set by the current that just turns on all LEES. Blue LEE has a typical power vs wavelength distribution 1103, with mean center wavelength 1018. Current range controls maximum brightness 1009. Minimum brightness 1015 is set by the current that just turns on all LEES.

Each LEE by way of example has a minimum threshold current typicality a few tens of micro-amps common to LEDs. Unless LEE are sorted or matched for the same threshold current at low drive levels just a few LEEs may illuminate, undesirable operation for area illumination. In the preferred embodiment LEEs are matched for mean wavelength, maximum brightness and minimum threshold current to make a quality uniform illumination product.

Device power dissipation and regulatory body control maximum power to LEEs. Note wavelengths of LED based LEE shift slightly 1022-1024 with temperature as changes size of crystal lattice. Thus a large color map or gamut area is achievable with varying LEE power and emitter selection. Royer and others have developed various maps and calibration procedures to determine color and effective temperature for a white LEE. The addition of White LEE with RGB permits very fine tuning of color temperature for critical illumination applications formerly not well addresses with common art RGB emitters. The unique ability of the instant invention to be cut, bend, folded to virtually any shape is new to the art.

FIG. 11 Four color flexible Emitter sheet top perspective. FIG. 11 is a magnified view with interconnect vias made larger for clarity to help teach the novel three-dimensional mesh network. Top component layer by way of example is fabricated from two ounce copper (Cu) foil. Removed for clarity are the insulating layers common to printed wiring board (PWB) fabrication. Similarly bottom layer by way of example is fabricated from two ounce copper (Cu) foil arranged as a plurality of parallel ribbons. Components such as LEEs, connectors and current-limiting elements are placed on component surface using common PWB pick and place equipment. Components are soldered or in communications with top layer with conductive inks, adhesives and or eutectic solders. Components are typically placed in regular grid arrays over extent of sheet. For non-area illumination LEE elements may be selectively placed as needed for particular application. Novel to the instant invention using common scissors or razor knife at time of installation the sheet may be cut along vertical, horizontal or diagonal lines to virtually any shape.

Power is applied via connectors 1106 and or lower profile right angle 1116 connectors. Connector pins 1101 and 1111 are in electrical communications to conductor(s) 1121. Connector pins 1102 and 1112 are in electrical communications to conductor(s) 1122. Connector pins 1103 and 1113 are in electrical communications to conductor(s) 1123. Connector pins 1104 and 1114 are in electrical communications to conductor(s) 1124. Connector pins 1105 and 1115 are in electrical communications to conductor(s) 1125. Via 1155 connects top conductor(s) 1125 to lower conductor(s) 1145. Via 1154 connects top conductor(s) 1124 to lower conductor(s) 1144. Via 1153 connects top conductor(s) 1123 to lower conductor(s) 1143. Via 1152 connects top conductor(s) 1122 to lower conductor(s) 1142. Via 1151 connects top conductor(s) 1121 to lower conductor(s) 1141.

First terminal of current-limiting resistor 1171 is in commutation with power conductor(s) 1121 second terminal is in communication with conductor(s) 1161 in turn is in commutations with LEE 1131 first terminal. First terminal of current-limiting resistor 1172 is in commutation with power conductor(s) 1122 second terminal is in communication with conductor(s) 1162 in turn is in commutations with LEE 1132 first terminal. First terminal of current-limiting resistor 1173 is in commutation with power conductor(s) 1123 second terminal is in communication with conductor(s) 1163 in turn is in commutations with LEE 1133 first terminal. First terminal of current-limiting resistor 1174 is in commutation with power conductor(s) 1124 second terminal is in communication with conductor(s) 1164 in turn is in commutations with LEE 1134 first terminal. Second terminals of LEE 1131,1132,1133,1334 are in commutations with return conductor(s) 1165 vias 1185 connect return conductor(s) to lower conductor(s) 1145.

The above LEE and current-limiting elements are uniformly distributed across the sheet. The unique bridging conductor geometry taught herein permits the flexible sheet to be cut along vertical, horizontal and diagonal lines while still maintain power to remaining LEES.

Figure 11A:
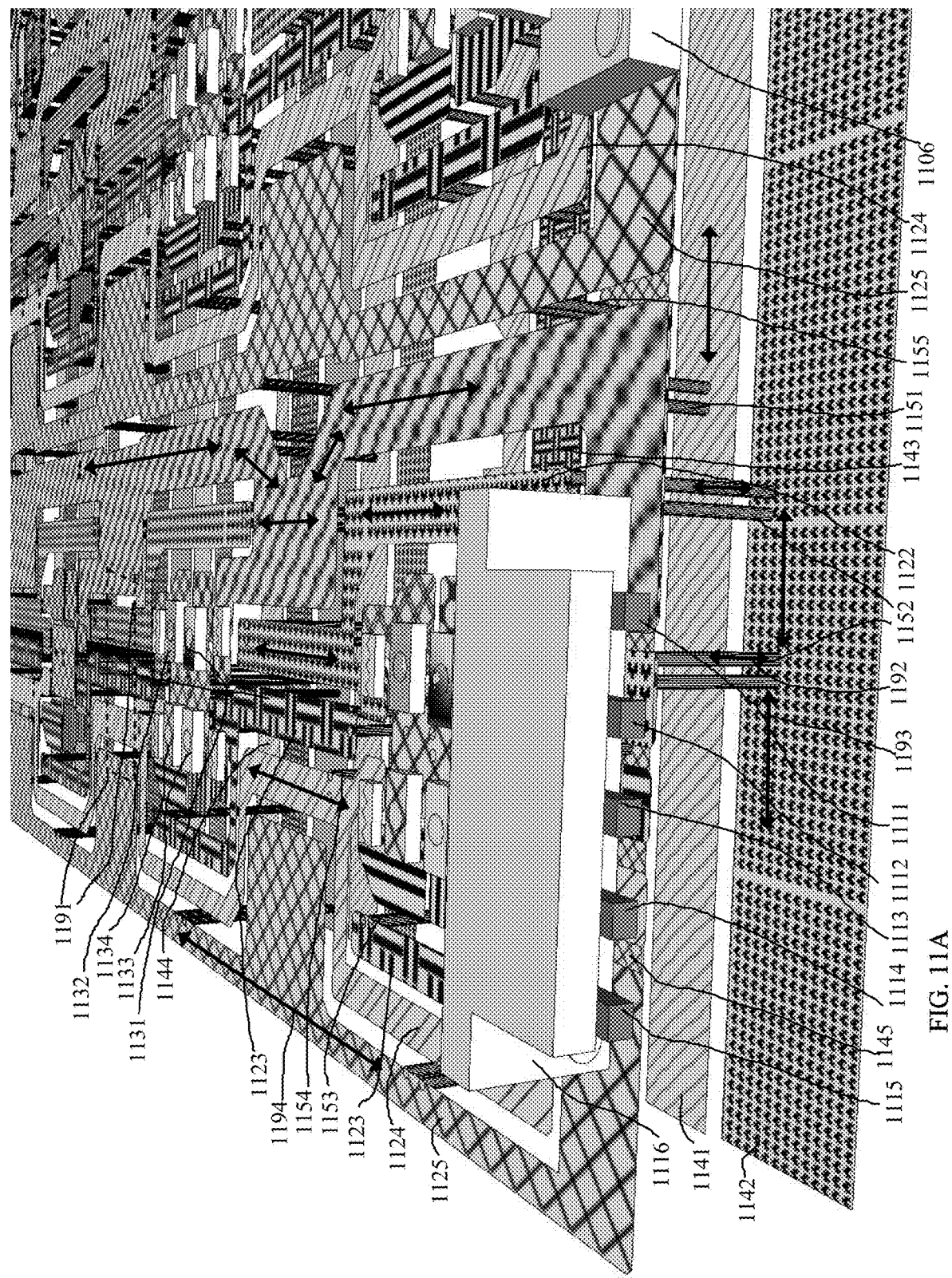
FIG. 11A is a side perspective view of the FIG. 11 embodiment.

FIG. 11A Four color flexible Emitter sheet top side perspective. FIG. 11A is a magnified side view with interconnect vias made larger for clarity to help teach the novel three-dimensional mesh network. Top component layer by way of example is fabricated from two ounce copper (Cu) foil. Removed for clarity are the insulating layers common to printed wiring board (PWB) fabrication. Similarly bottom layer by way of example is fabricated from two ounce copper (Cu) foil arranged as a plurality of parallel ribbons. Components such as LEEs, connectors and current-limiting elements are placed on component surface using common PWB pick and place equipment. Components are soldered or in communications with top layer with conductive inks, adhesives and or eutectic solders. Components are typically placed in regular grid arrays over extent of sheet. For non-area illumination LEE elements may be selectively placed as needed for particular application. Novel to the instant invention using common scissors or razor knife at time of installation the sheet may be cut along vertical, horizontal or diagonal lines to virtually any shape.

Power is applied via connectors 1106 and or lower profile right angle 1116 connectors. Connector pins 1111 are in electrical communications to conductor(s) 1121. Connector pins 1112 are in electrical communications to conductor(s) 1122. Connector pins 1113 are in electrical communications to conductor(s) 1123. Connector pins 1114 are in electrical communications to conductor(s) 1124. Connector pins 1115 are in electrical communications to conductor(s) 1125. Via 1155 connects top conductor(s) 1125 to lower conductor(s) 1145. Via 1154 connects top conductor(s) 1124 to lower conductor(s) 1144. Via 1153 connects top conductor(s) 1123 to lower conductor(s) 1143. Via 1152 connects top conductor(s) 1122 to lower conductor(s) 1142. Via 1151 connects top conductor(s) 1121 to lower conductor(s) 1141. The lower conductors 1141, 1142, 1143, 1144 and 1145 conduct current 1193 substantially orthogonal 1194 to upper conductors 1121, 1122, 1123, 1124 and 1125. Vias 1151, 1152, 1153, 1154 and 1155 carry current vertically 1192. This unique mesh design enables redundant power source to each LEE. Thus permitting the LEE array to be cut along vertical, horizontal and diagonal lines and maintaining power to remaining LEEs 1131,1132,1133 and 1134 as taught in FIG. 11.

Redundant solder pads 1191 are distributed across LEE array permitting simple placement of power connectors 1106 or 1116 were needed. Jumper connectors are not shown.

The above LEE and current-limiting elements are uniformly distributed across the sheet. The unique bridging conductor geometry taught herein permits the flexible sheet to be cut along vertical, horizontal and diagonal lines while still maintain power to remaining LEES. This instant invention advances the art in flexible sheet offering powering four RGBW or other wavelength emitters as taught in FIG. 10. New applications such as anti-microbial UV LEEs emitters with white LEE for hospital or veterinary applications. Or addition of common art IR LEE emitters combined with other colors/white for therapeutic tissue heating applications. Addition of for example and not by way of limitation UV LEEs in the ultra violet range of 380-400 nm and or violet range of 400-420 nm made by Luxeon (370 W. Trimble Road, San Jose, Calif. 95131, USA) may be used for curing resins, medical (anti-microbial), security (invisible ink), UV photo reaction, analytical instrumentation, specialty lighting with fluorescent dye inks and more. The addition of over molded or LEE integrated lenses makes spot lighting or very diffuse light in confined spaces possible at low costs. FIGS. 11, 11A disclose the red green blue white (RGBW) embodiment with four LEEs opening doors to more applications. The ability to safely deliver a wide range of color illumination in moist/underwater, explosive gas and or corrosive locations applied to virtually any surface shape opens many application doors indeed thus greatly advances the art of illumination.

Although the present invention has been described with reference to the disclosed embodiments, numerous modifications and variations can be made and still the result will come within the scope of the invention. No limitation with respect to the specific embodiments disclosed herein is intended or should be inferred. Each apparatus embodiment described herein has numerous equivalents.

We claim:

1. A flexible, foldable and cuttable 3D light emitting element (LEE) array sheet comprising:
   an X-Y axis upper sheet forming a planar mesh network of positive conductors powering a plurality of imbedded LEE's;
   each LEE having a series connected current limiting resistor;
   a Z axis connection of vias from the X-Y axis upper sheet to a lower ribbon network forms a low impedance 3D mesh network to the plurality of imbedded LEE's; and
   wherein the LEE 3D array sheet can be cut in an X, a Y and a diagonal direction while still maintaining illumination of the remaining LEE'S at a relatively constant illumination level as perceived by a human eye.

2. The 3D LEE array sheet of claim 1, wherein a resistance of each current limiting resistor is larger than a total resistance of the lower ribbon network.

3. The 3D LEE array sheet of claim 2, wherein each current limiting resistor is at least ten times the resistance of the lower ribbon network.

4. The 3D LEE array sheet of claim 1, wherein the Z axis connection of vias to the lower ribbon network provides an independent and redundant plurality of current paths to each LEE.

5. The 3D LEE array sheet of claim 4, wherein a plurality of LEE's further comprises a variable spectrum light output using a plurality of variable power sources connected in parallel to groups of different colored LEE's.

6. The 3D LEE array sheet of claim 5, wherein the different colored LEE groups further comprise two different LEE color groups each group selected from a group consisting of red, orange, yellow, green, blue, indigo, violet, infra red, and ultra violet.

7. The 3D LEE array sheet of claim 6 further comprising a variable power supply to each of the two different LEE color groups.

8. The 3D LEE array sheet of claim 5, wherein the different colored LEE groups further comprise four different color groups each group selected from a group consisting of red, orange, yellow, green, blue, indigo, violet, infra red, and ultra violet.

9. The 3D LEE array sheet of claim 8 further comprising a variable power supply to each of the four different LEE color groups.

10. The 3D LEE array sheet of claim 1, wherein a depth of the 3D LEE array sheet from the upper sheet to the lower ribbon network ranges from about 2 mm to about 10 mm.

11. The 3D LEE array sheet of claim 1, wherein the lower ribbon network further comprises bridge segments with vias forming a plurality of return current paths bridging around the planar mesh network of positive conductors.

12. The 3D LEE array sheet of claim 1, wherein at least one of a top or a bottom of the 3D LEE array sheet further comprises a conformal coating.

13. The 3D LEE array sheet of claim 1, wherein the lower ribbon network is made of two ounce copper.

14. The 3D LEE array sheet of claim 1, wherein a group of LEE's further comprise a multiple LED emitter high voltage unit.

15. The 3D LEE array sheet of claim 1, wherein the 3D LEE array sheet further comprises a sheet to sheet connector.

16. A flexible 3D LEE sheet comprising:
a top layer comprising a mesh network of positive conductors powering a plurality of imbedded LEE's;
each of the LEE's having a series connected current limiting resistor to form a low impedance power plane;
a plurality of vertical vias descending from the mesh network of positive conductors to connect to a lower low impedance power plane;
each current limiting resistor having a resistance of at least 50 times a total resistance of the lower low impedance power plane;
the lower low impedance power plane forming a plurality of return current paths bridging around the mesh network of positive conductors; and
wherein the 3D LEE sheet can be cut in an X and a Y and a diagonal direction so as to remove a plurality of LEE's while still maintaining illumination of a remaining set of LEE's which are maintained at a relatively constant illumination level as perceived by a human eye.

17. The 3D LEE sheet of claim 16, wherein the plurality of imbedded LEE's further comprises at least two different groups of different color LEE's, each having a separate power supply, and at least one power supply having a variable power output to vary an output wavelength of its LEE group.

18. The 3D LEE sheet of claim 16, wherein a depth of the 3D LEE sheet ranges from 2 to 10 mm.

19. A flexible lighting sheet comprising:
a top flexible upper sheet forming a planar mesh of conductors powering a plurality of imbedded LEE's;
each LEE having a series connected current limiting resistor;
a plurality of vertical vias descending from the top flexible upper sheet to connect to a lower low impedance power grid;
a ratio of resistance of one current limiting resistor to a resistance of the low impedance power grid of at least ten to one;
said top flexible upper sheet in combination with the plurality of vertical vias and the lower low impedance power grid forming a redundant plurality of current paths to each LEE; and
a removal of LEE's in an X, a Y or a diagonal cut maintains power to a remaining set of LEE's.

20. The flexible lighting sheet of claim 19, wherein the plurality of imbedded LEE's further comprises at least two groups of independently powered LEE's, wherein at least one of the independently powered LEE's further comprises a variable power supply to vary a color output of the plurality of imbedded LEE's.

* * * * *